United States Patent
Saunders et al.

(10) Patent No.: US 6,930,490 B2
(45) Date of Patent: Aug. 16, 2005

(54) TRACTION MOTOR FAULT DETECTION SYSTEM

(75) Inventors: John M. Saunders, Naperville, IL (US); John E. Madsen, Lemont, IL (US)

(73) Assignee: Electro-Motive Diesel, Inc., LaGrange, IL (US)

( * ) Notice: Subject to any disclaimer, the term of this patent is extended or adjusted under 35 U.S.C. 154(b) by 0 days.

(21) Appl. No.: 10/440,049

(22) Filed: May 16, 2003

(65) Prior Publication Data

US 2004/0227520 A1 Nov. 18, 2004

(51) Int. Cl.[7] .......................... G01R 31/08; G01R 30/02
(52) U.S. Cl. ..................... 324/511; 324/522; 318/490
(58) Field of Search .................. 324/511, 512, 324/509, 510, 522, 523, 525; 361/18, 30; 702/57–59; 318/490, 434, 139

(56) References Cited

U.S. PATENT DOCUMENTS

| | | | | |
|---|---|---|---|---|
| 4,996,477 A | * | 2/1991 | Keeler et al. | 324/772 |
| 5,528,445 A | * | 6/1996 | Cooke et al. | 361/20 |
| 5,550,432 A | * | 8/1996 | Barker | 315/5 |
| 5,990,648 A | * | 11/1999 | Kumar et al. | 318/490 |
| 6,078,173 A | * | 6/2000 | Kumar et al. | 324/158.1 |
| 6,393,373 B1 | * | 5/2002 | Duyar et al. | 702/115 |
| 6,421,618 B1 | * | 7/2002 | Kliman et al. | 702/58 |
| 6,456,908 B1 | * | 9/2002 | Kumar | 701/19 |
| 6,549,869 B1 | * | 4/2003 | Piety et al. | 702/122 |

* cited by examiner

*Primary Examiner*—Anjan Deb
*Assistant Examiner*—Jeff Natalini
(74) *Attorney, Agent, or Firm*—Cook, Alex, McFarron, Manzo, Cummings & Mehler, Ltd.

(57) ABSTRACT

A method of detecting faults in a traction motor installation having a plurality of AC traction motors powered from a common power source, each of the traction motors being connected by associated motor cables to a cable junction and the common power source being connected to the cable junction by main cables, includes disconnecting the power source from the main cables and performing initial short circuit to ground, short circuit between phases and leakage to ground tests on the traction motors through the main cables. When a fault is detected by the initial tests, at least one detailed test is performed by applying a predetermined voltage to the main cables and sensing current flow in the motor cables connected to each of the motors. The detailed test is one of a detail short circuit to ground test, a detail short circuit phase to phase test, and a detail leakage to ground test.

20 Claims, 12 Drawing Sheets

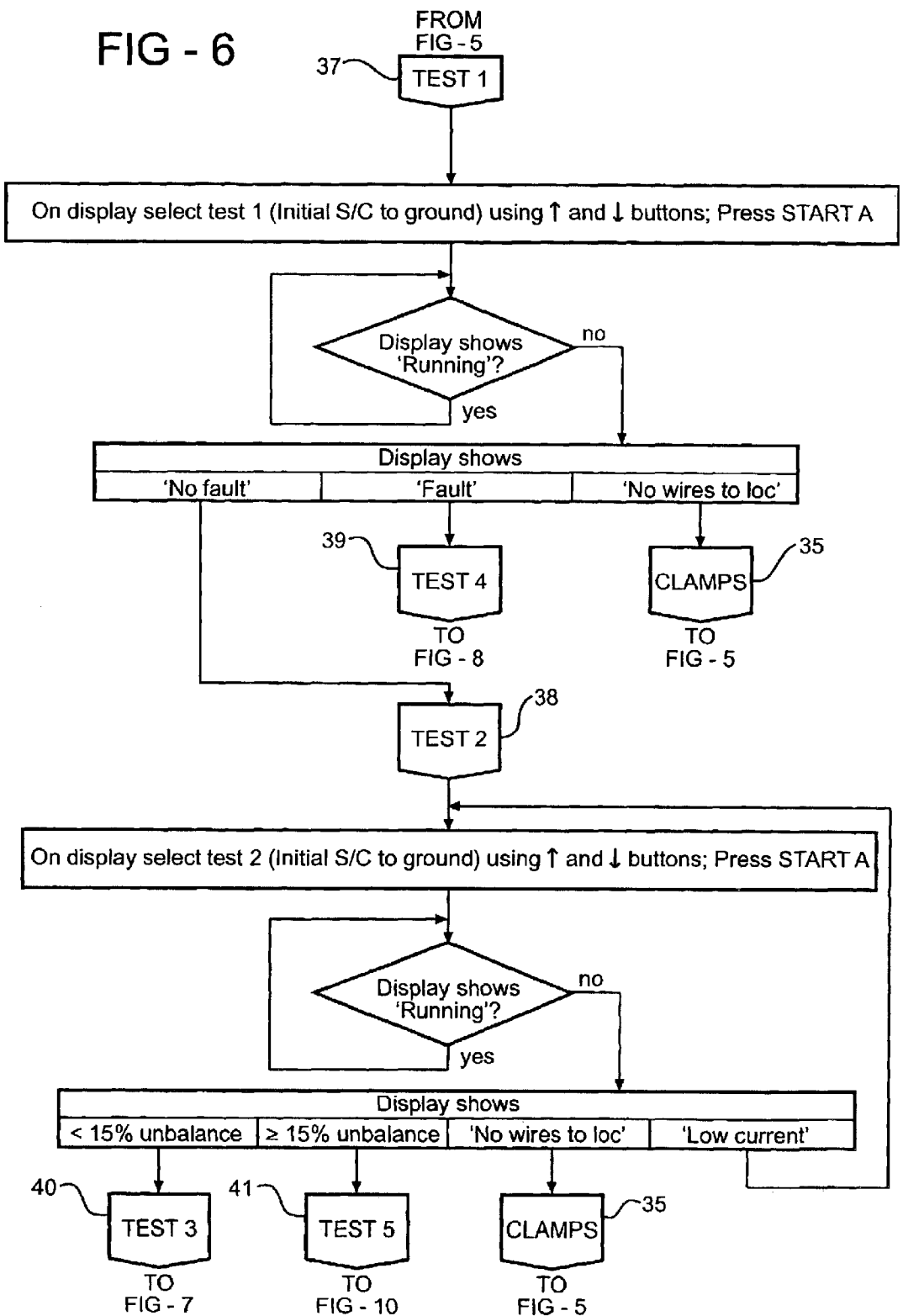

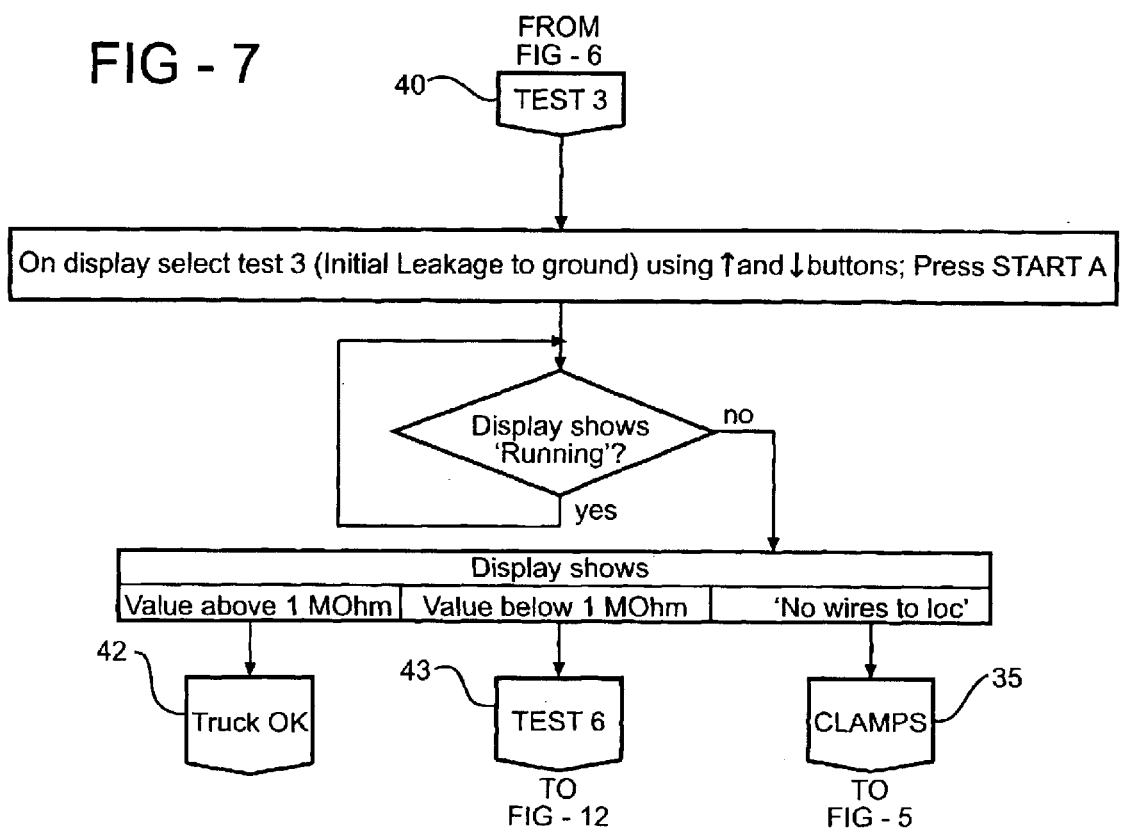
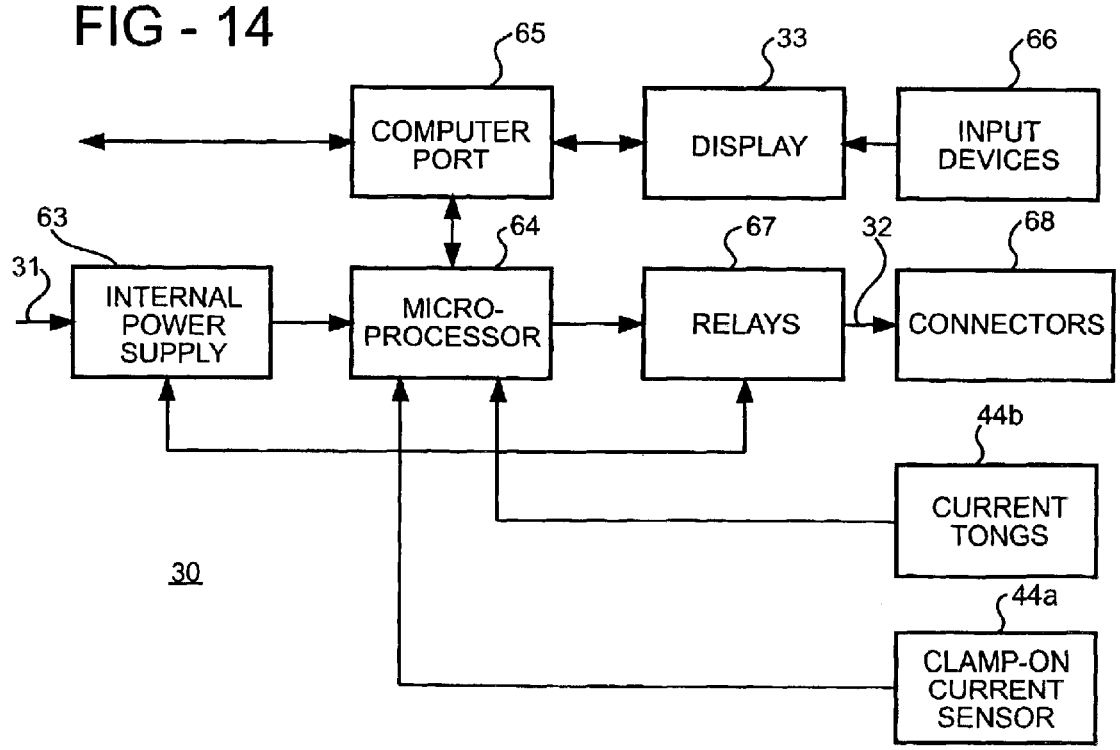

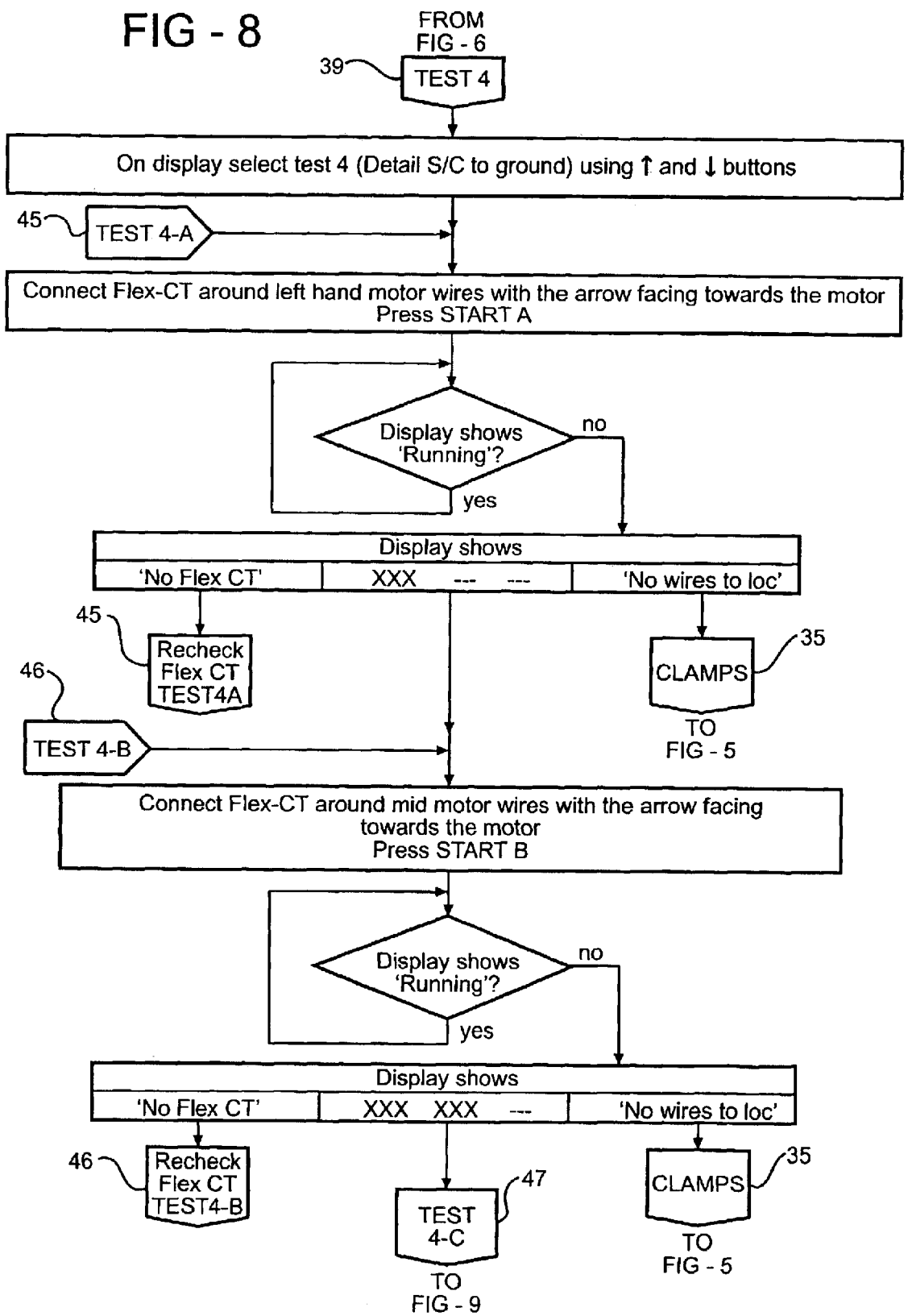

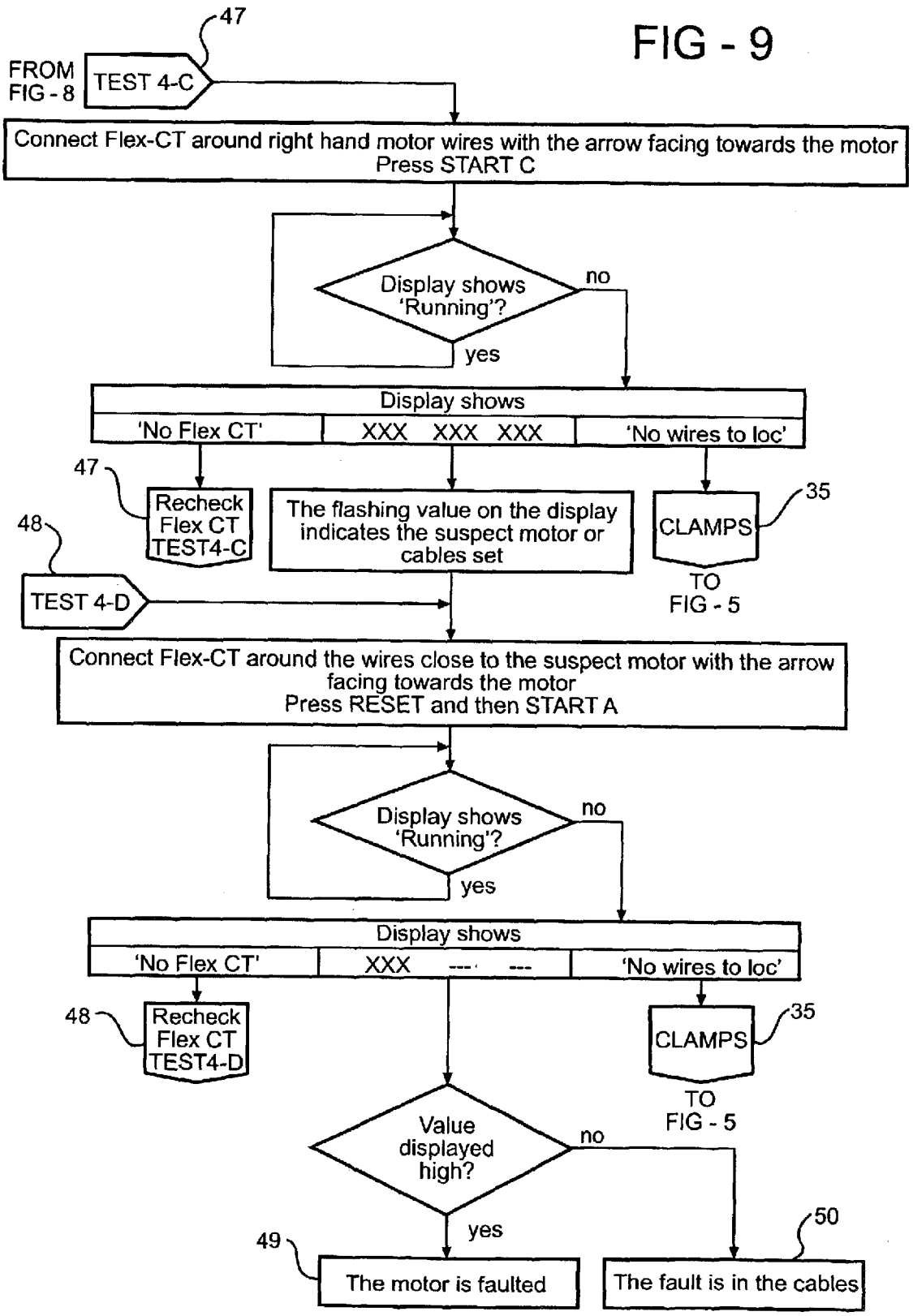

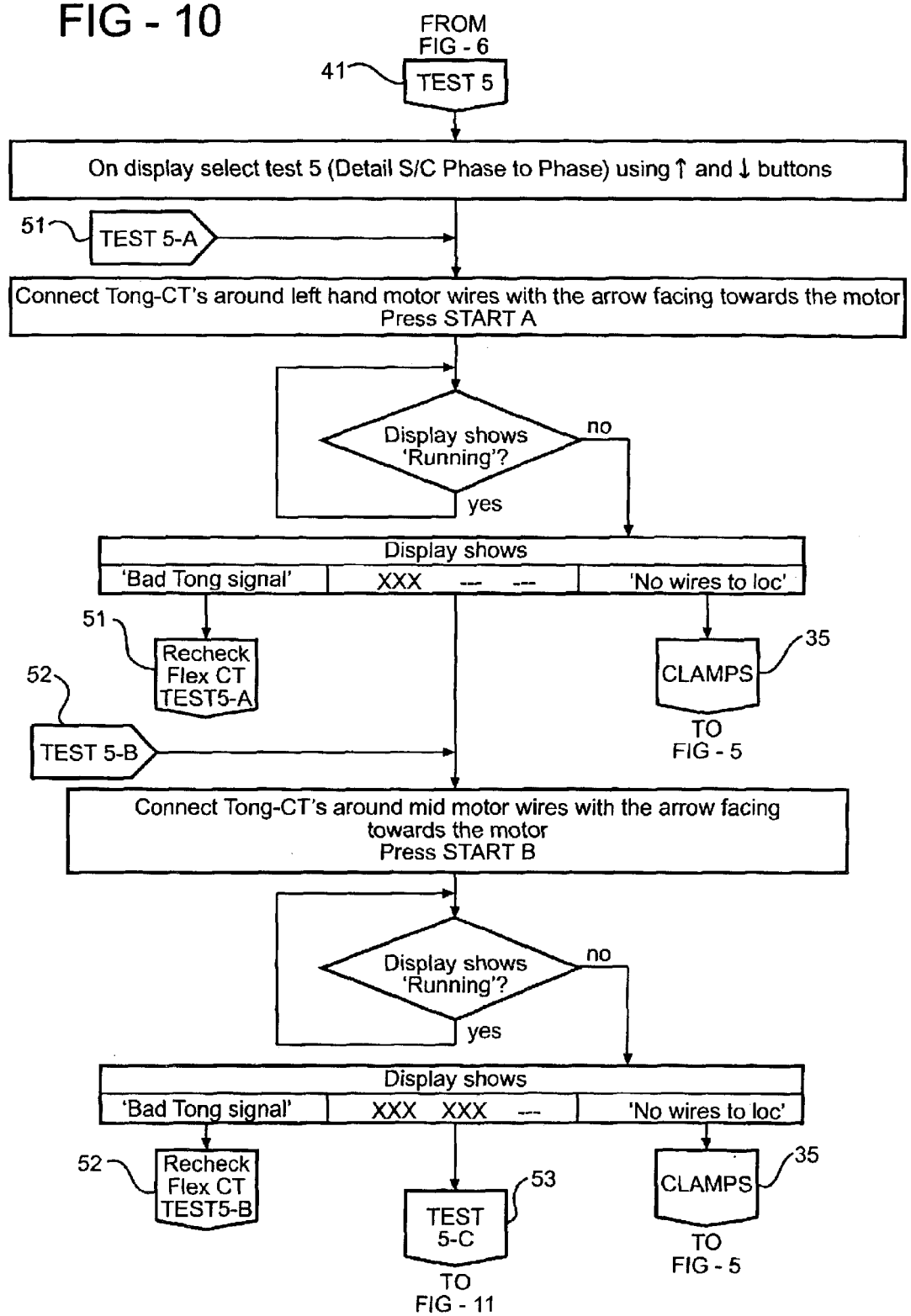

TRACTION MOTOR FAULT DETECTION SYSTEM

BACKGROUND OF THE INVENTION

The present invention relates generally to a method for testing electric motors and, in particular, to a system for detecting faults in multiple AC traction motor installations.

The present AC traction motor architecture employed in electric locomotive traction devices or trucks connects each phase output from an inverter to each traction motor through an intermediate wiring harness, commonly referred to as the "milking machine". The milking machine splits each inverter phase output cable into a set of parallel motor cables which greatly complicates the identification of faulted motors within a truck assembly. Historically, under worst case conditions, one has to disassemble all parallel motor connections in order to locate one motor that had developed a fault. This is a time consuming process.

SUMMARY OF THE INVENTION

The traction motor fault detection system according to the present invention concerns a diagnostic system that identifies faulted motors without disconnection of the traction motor cables. The system detects motor ground faults (shorts, arcing, leakage) and phase to phase faults (shorts, arcing). The design objective of the system was to reduce the mean time to locate a malfunctioning motor to less than 30 minutes in 75% of the cases. In fact, the system according to the present invention will detect up to 95% of fault cases in less than 10 minutes.

The present invention concerns a method of detecting faults in a traction motor installation having a plurality of AC traction motors powered from a common power source, each of the traction motors being connected by associated motor cables to a cable junction and the common power source being connected to the cable junction by main cables. The method includes the steps of: disconnecting the power source from the main cables; performing an initial short circuit to ground test on the traction motors through the main cables; performing an initial short circuit between phases test on the traction motors through the main cables; performing an initial leakage to ground test on the traction motors through the main cables; and when a fault is detected by the initial tests, performing at least one detailed test by applying a predetermined voltage to the main cables and sensing current flow in the motor cables connected to each of the motors. The detailed test is one of a detail short circuit to ground test, a detail short circuit phase to phase test, and a detail leakage to ground test.

The detail short circuit to ground test includes sensing a total value of current flow in the motor cables for each of the traction motors and designating the one of the traction motors with the highest value as having a suspected fault. The predetermined voltage can be a pulsed 4.5 kV signal with a high frequency content and the current sensor can be a Rogowski-type flexible clamp-on current sensor.

The detail short circuit phase to phase test includes sensing a current flow in each of the motor cables for each of the traction motors, calculating a winding impedance unbalance value from the current flow and designating the one of the traction motors with the highest value as having a suspected fault. The predetermined voltage can be a pulsed 4.5 kV signal with a high frequency content and a separate current sensor can be used to sense the current flow in each of the motor cables.

The detail leakage to ground test includes sensing a current flow in the motor cables for each of the traction motors, calculating a resistance to ground value from the current flow and designating the one of the traction motors with the lowest value as having a suspected fault. The predetermined voltage can be a constant 60 Hz 1 kV signal and the current sensor can be a Rogowski-type flexible clamp-on current sensor.

An apparatus for performing the method according to the present invention can be a portable tester having a display for visually indicating results of the initial tests and the at least one detailed test and being connected to the current sensors.

BRIEF DESCRIPTION OF THE DRAWINGS

The above as well as other advantages of the present invention will become readily apparent to those skilled in the art from the following detailed description of a preferred embodiment when considered in the light of the accompanying drawings in which:

FIGS. 5–13 are flow diagrams of the method of operation of the fault detection system in accordance with the present invention; and FIG. 14 is a block diagram of a portable tester for performing the fault detection method according to the present invention.

DESCRIPTION OF THE PREFERRED EMBODIMENT

Figure 1:
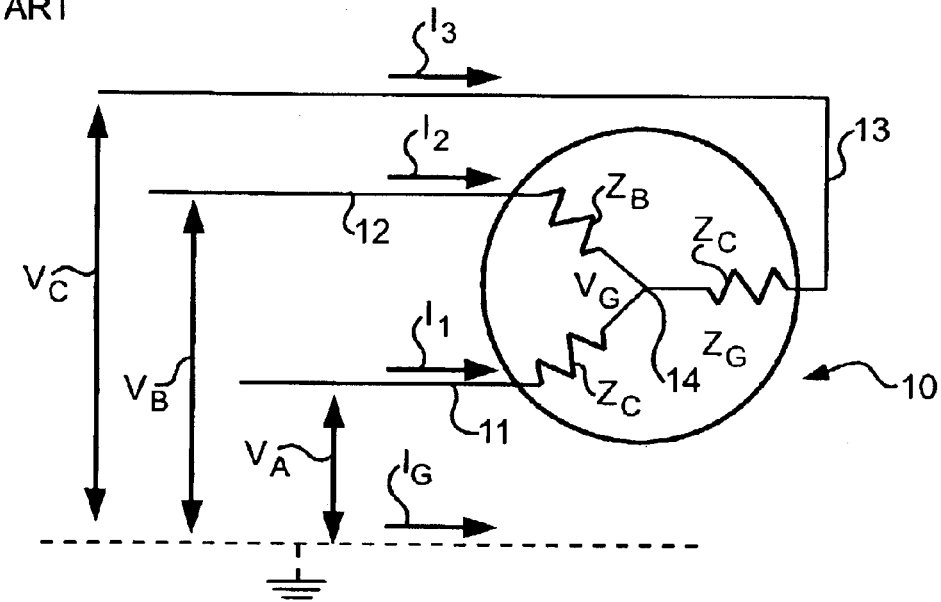
FIG. 1 is a schematic diagram of a typical three phase AC traction motor.
Figure 2:
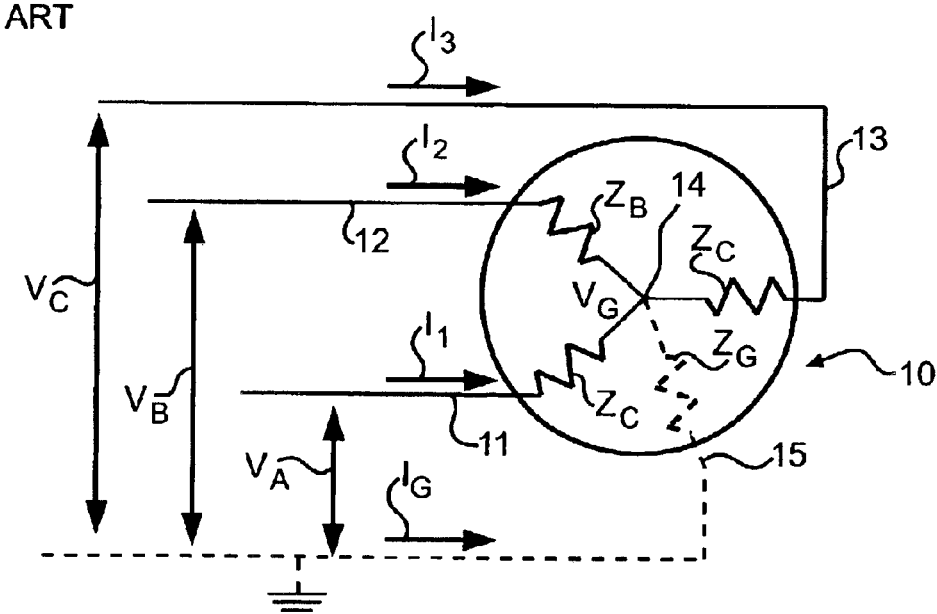
FIG. 2 is a schematic diagram showing the motor of FIG. 1 with an internal ground fault.

FIG. 1 is a schematic diagram of a typical three phase electric motor 10 having winding terminals 11, 12 and 13. Three stator windings $Z_A$, $Z_B$ and $Z_C$ are Y-connected with one end connected to a center node 14 and opposite ends connected to the terminals 11, 12 and 13 respectively. Under normal operating conditions, i.e., no fault, the motor 10 can be described as a three terminal, two port device. When the motor 10 has an internal ground fault, it becomes a four terminal, three port device as shown in FIG. 2 wherein the ground fault is represented as an impedance $Z_G$ connected between the center node 14 and a fourth terminal 15. Absent a ground fault, a motor with an internal phase short between any two of the terminals 11, 12 and 13, can be described as a two terminal, one port device.

The condition of the motor 10 can be evaluated by connecting a selected pair of the terminals 11, 12 and 13 to ground and applying a known test voltage to the remaining terminal. For example, test voltages $V_A$, $V_B$ and $V_C$ are shown in FIGS. 1 and 2 as being applied between ground and the terminals 11, 12 and 13 respectively. By sensing the branch currents, currents 11, 12 and 13 in the stator windings $Z_A$, $Z_B$ and $Z_C$ respectively, together and the non-grounded branch current separately, the condition of the motor 10 can be determined.

According to Kirchhoff's current laws, the following boundary conditions can result during such testing:

1. The instantaneous sum of the three branch currents, $I_1$, $I_2$ and $I_3$, is zero.

2. The instantaneous sum of the three branch currents is not zero.

3. The non-grounded terminal branch current is zero.

4. The non-grounded terminal branch current is not zero and is less than the source current limit $I_{MAX}$.

5. The non-grounded terminal branch current is not zero and is bounded by the source current limit.

From the above-stated current measurement results, the following conclusions can be made:

1. The motor has a ground fault; $I_G > 0$.
2. The motor does not have a ground fault; $I_G = 0$.
3. The motor phase is open circuit; e.g., $I_1 = 0$.
4. The motor phase is neither open circuited nor short circuited; e.g., $I_{MAX} > I_1 > 0$.
5. The motor phase is short circuited; e.g., $I_1 = I_{MAX} > 0$.

Figure 3:
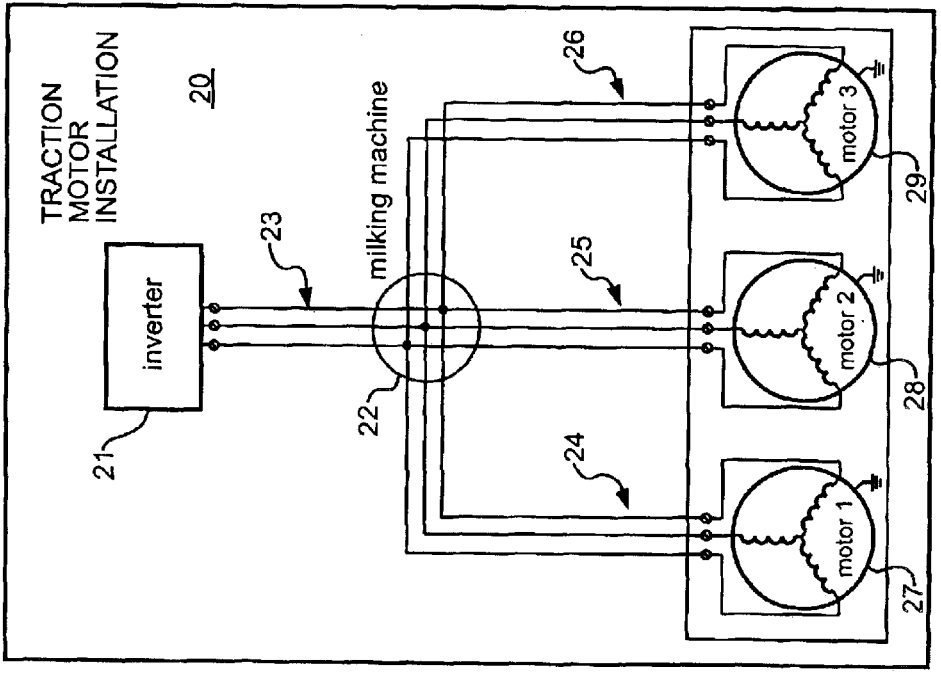
FIG. 3 is a schematic diagram of a typical multiple AC traction motor installation for a locomotive truck.

There is shown in FIG. 3 a typical traction motor installation 20 for an electric locomotive that can be tested for faults by the system according to the present invention. An inverter 21 provides three phase AC electrical power to a cable junction or "milking machine" 22 via main cables 23. The milking machine 22 splits each inverter phase cable 23 into parallel sets of motor cables such as cables 24, 25 and 26 for a three motor installation. Thus, the inverter 21 is connected by the motor cables 24 to a first AC traction motor 27, by the motor cables 25 to a second AC traction motor 28, and by the motor cables 26 to a third AC traction motor 29. The parallel connected cables 24, 25 and 26 greatly complicate the identification of faulted motors within the traction motor installation 20.

Figure 4A:
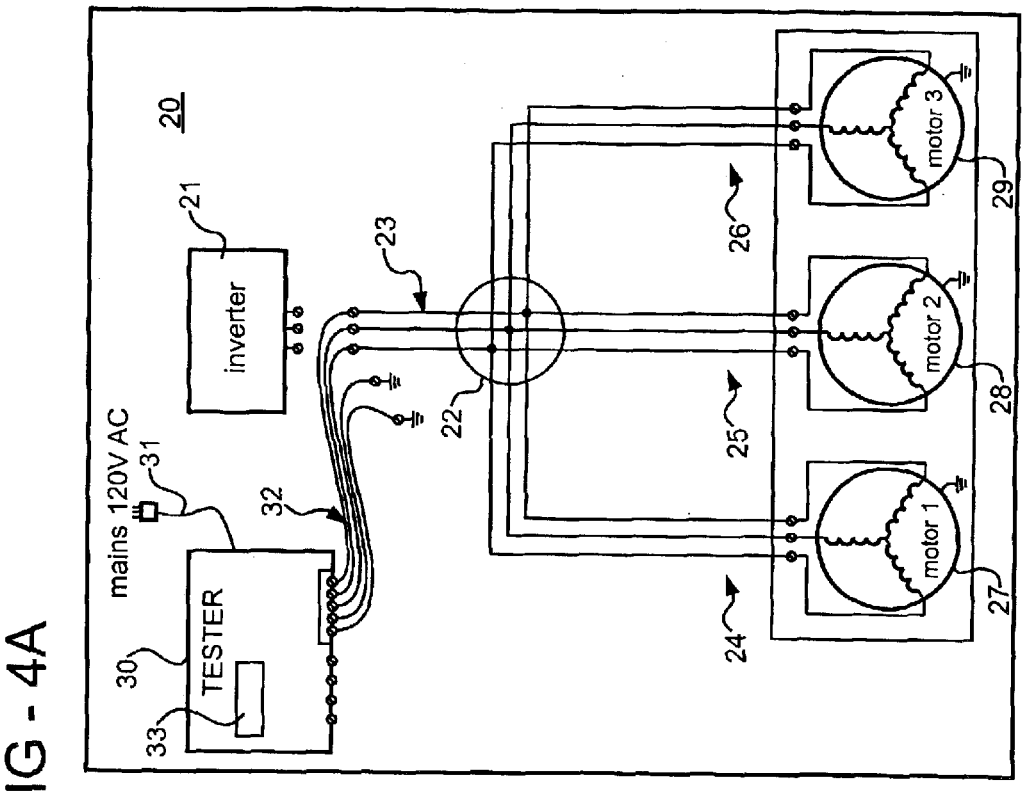
FIGS. 4A–C are schematic diagrams of the traction motor installation shown in FIG. 3 connected to a fault detection system operating to perform various tests in accordance with the present invention.

In FIG. 4A, there is shown the traction motor installation 20 connected to a testing apparatus, tester 30, in an initial test setup. The tester 30 is a portable device having a power cord 31 that can be inserted into any standard 120V AC outlet. For the detection of short circuit and arcing faults, a pulsed 4.5 kV signal with a high frequency content, i.e., having a rising edge with a high dV/dt, is used. The signal is similar to what is described in standards used for surge testing electrical and electronic equipment, such as EN50082-1, but scaled up to appropriate voltage and energy levels. The reason for using a high dV/dt signal is that it induces a high intensity electric field using moderate applied voltage thus simulating a flashover in the case of isolation flaws. The energy level of the signal is at all times exactly defined and therefore limited.

To the tester 30 there is no distinction between a short circuit and an arcing fault, since they yield the same current response. Thus, the term "short circuit" will be used hereafter to refer to both short circuits and arcing faults. Short circuit faults are detected by looking at the current response caused by the pulsed signal: 1) in all phases connected together while the signal is applied between phases together and ground, typically the motor housing, and 2) in each individual phase while the signal is applied between phases.

For the detection of ground leakage faults, a constant 60 Hz 1 kV voltage is generated. Since the installation is already being subjected to 4.5 kV during the short circuit and arcing fault test, it is possible to use a voltage substantially lower, but still high enough to generate measurable results. The voltage is applied between all phases connected together and ground, thereby causing a relatively large reactive current to flow through the capacitance of the motor windings with respect to the motor housing. Any ground fault on the motor will cause an additional but possibly very small resistive current to flow as well and the tester 30 detects the resistive current component.

Referring to FIG. 4A, although any test can be run at any time, an "Initial" test is run to set a reference point. The main cables 23 are disconnected from the inverter 21 and connected to three test leads 32 of the tester 30. Two more of the test leads 32 are connected to different locations on the locomotive chassis for ground. An operator causes the tester 30 to first perform a short circuit to ground test, using an internal current sensor to measure the response. The result is a fault/no fault message from the tester 30. Second, the operator causes the tester 30 to perform a short circuit between phases test, using three internal current sensors to measure the responses. The result is presented by the tester 30 as a winding impedance unbalance percentage. Third, the operator causes the tester 30 to perform a ground leakage test, using an accurate internal current sensor, which can only be employed during this particular test phase. The leakage test results in an isolation resistance being presented to the operator by the tester 30.

Figure 5:
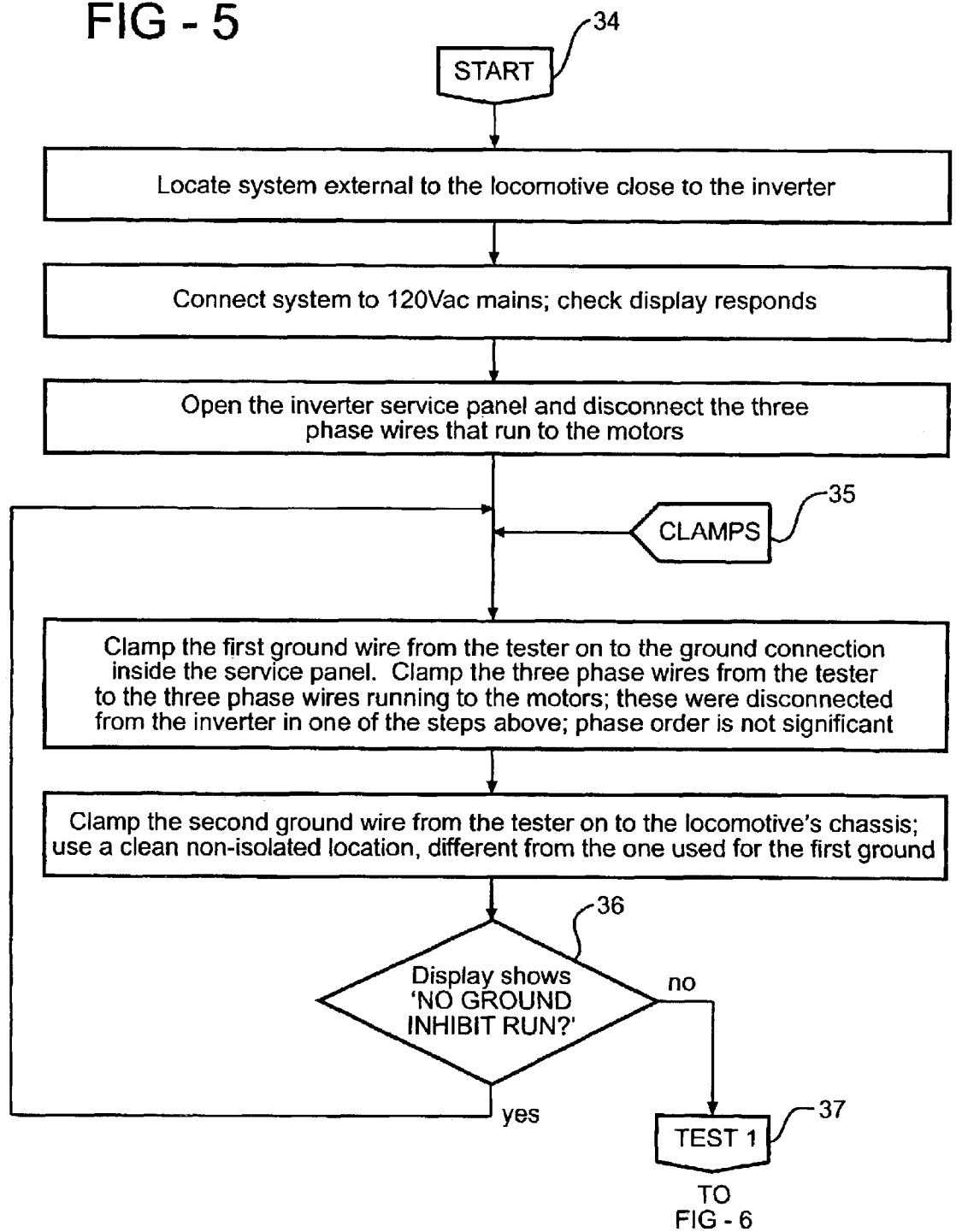

The "Initial" test steps are shown in FIGS. 5"7. The method of testing according to the present invention begins at "START" 34 of FIG. 5 and proceeds through several steps to connect the tester 30 to the traction motor installation 20. As explained below, various results of subsequent testing can cause the method to return to FIG. 5 at "CLAMPS" 35. A decision point 36 checks for proper ground and, if the proper ground is indicated, the method branches at "TEST 1" 37 to FIG. 6.

The method continues in FIG. 6 at "TEST 1" 37 and performs the initial short circuit to ground test described above. A "No fault" result causes the test to continue at "TEST 2" 38. A "Fault" result causes an exit at "TEST 4" 39 to FIG. 8 described below. A "No wires to loc" result leads back to FIG. 5 at "CLAMPS" 35. Test 2 is the initial short circuit between phases test described above. A "<15% unbalance" result leads to "TEST 3" at FIG. 7. A "≧15% unbalance" result leads to "TEST 5" at FIG. 10. A "No wires to loc" result leads back to FIG. 5 at "CLAMPS" 35. A "Low current" result leads back to "TEST 2" 38. The method continues in FIG. 7 at "TEST 3" 40 and performs the initial leakage to ground test described above. A "Value above 1 MOhm" result causes the test to terminate at "Truck OK" 42. A "Value below 1 MOhm" result causes an exit at "TEST 6" 43 to FIG. 12 described below. A "No wires to loc" result leads back to FIG. 5 at "CLAMPS" 35.

If during the initial tests the operator finds or suspects a fault, he may proceed by doing a detailed test, depending on the type of fault. For a detailed short circuit to ground rest, the operator connects a flexible current tong 44a to the tester 30 as shown in FIG. 4b. The tong 44a is a Rogowski-type flexible clamp-on current sensor that replaces the internal current sensor used in the initial part of the test and senses the total current in all of the motor cables 24 (25 and 26). The detailed short circuit to ground test is performed as shown in FIGS. 8 and 9 as test sections 4-A through 4-D. The operator must repeat this test for each individual motor 27, 28 and 29. The collected data then reveals the faulty motor.

At the end of test section 4-A, if the display 33 shows "No Flex CT", the method rechecks by returning at "TEST 4-A" 45. If the display shows "XXX --- ---", the "TEST 4-B" 46 is entered. If the display shows "No wires to loc", that result leads back to FIG. 5 at "CLAMPS" 35. At the end of test section 4-B, if the display 33 shows "No Flex CT', the method rechecks by returning at "TEST 4-B" 46. If the display shows a result "XXX XXX ---", the "TEST 4-C" 47 is entered at FIG. 9. If the display shows "No wires to loc", that result leads back to FIG. 5 at "CLAMPS" 35.

FIG. 9 shows the test sections 4-C and 4-D. At the end of test section 4-C, if the display 33 shows "No Flex CT", the method rechecks by returning at "TEST 4-C" 47. If the display shows "XXX XXX XXX", the "TEST 4-D" 48 is entered. If the display shows "No wires to loc", that result leads back to FIG. 5 at "CLAMPS" 35. At the end of test section 4-D, if the display 33 shows "No Flex CT", the method rechecks by returning at "TEST 4-D" 48. If the display shows a result "XXX --- ---", either a fault message "The motor is faulted" 49 or a fault message "The fault is in the cables" 50 is displayed. If the display shows "No wires to loc", that result leads back to FIG. 5 at "CLAMPS" 35.

Figure 4C:
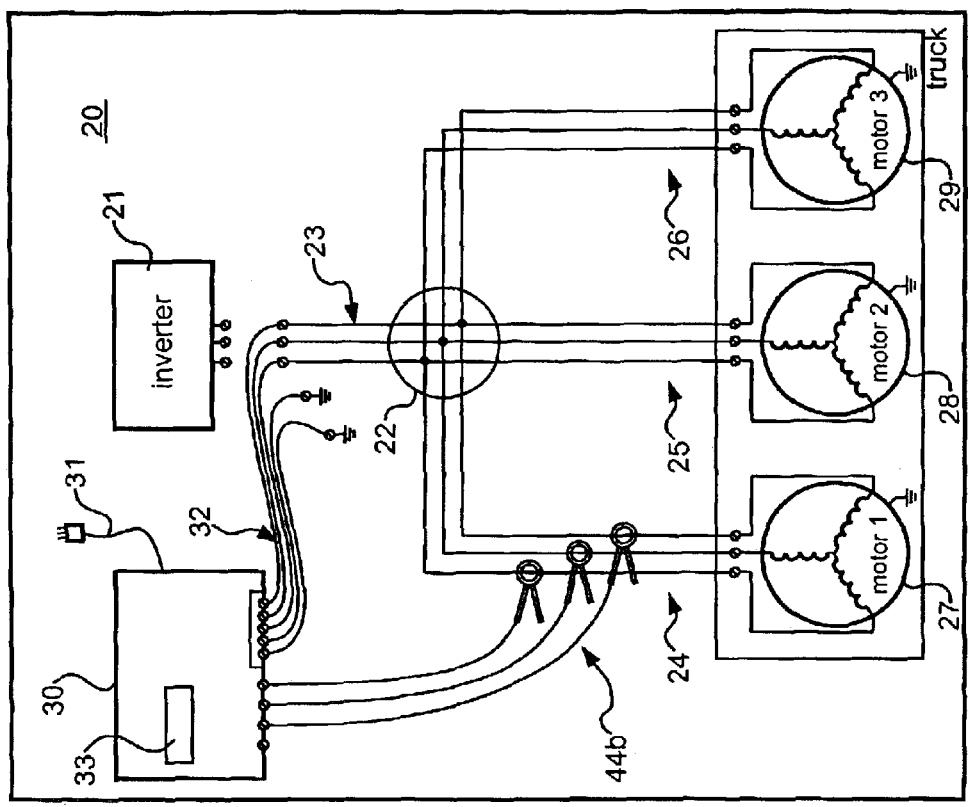
Figure 4B:
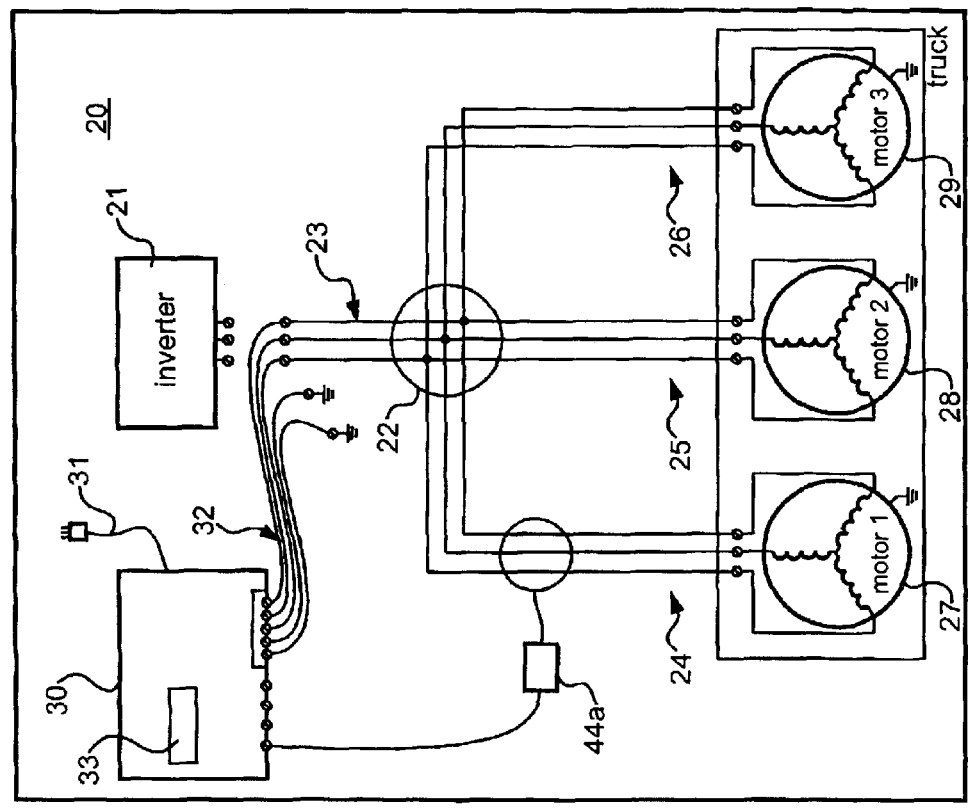
Figure 11:
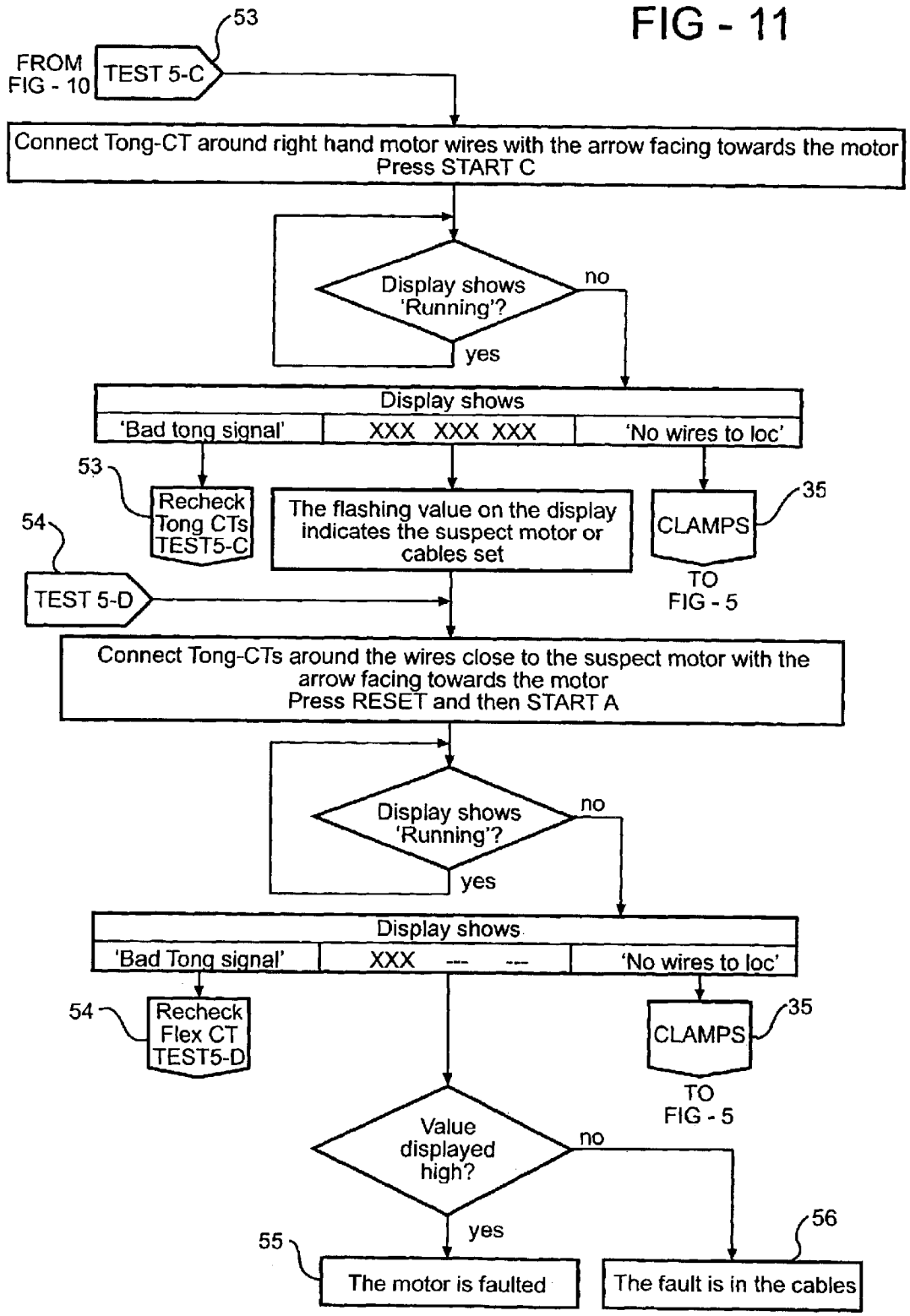

For a detailed short circuit phase to phase test, the operator positions individual current tongs 44b on each of the motor cables 24 (25 and 26) as shown in FIG. 4c. The tongs 44b replace the internal current sensors used in the initial part of the test. The short circuit between phases test is performed as shown in FIGS. 10 and 11. The operator must repeat this test for each individual motor. The collected data will reveal the faulty motor.

FIG. 10 shows test sections 5-A and 5-B of the detailed short circuit phase to phase test starting at "TEST 5" 41. At the end of the test section 5-A, if the display 33 shows "Bad Tong signal', the method rechecks by returning at "TEST 5-A" 51. If the display shows "XXX --- ---", the "TEST 5-B" 52 is entered. If the display shows "No wires to loc", that result leads back to FIG. 5 at "CLAMPS" 35. At the end of the test section 5-B, if the display 33 shows "Bad Tong signal', the method rechecks by returning at "TEST 5-B" 52. If the display shows a result "XXX XXX ---", the method proceeds to test section "TEST 5-C" 53 at FIG. 11. If the display shows "No wires to loc", that result leads back to FIG. 5 at "CLAMPS" 35.

FIG. 11 shows the test sections 5-C and 5-D. At the end of test section 5-C, if the display 33 shows "Bad Tong signal", the method rechecks by returning at "TEST 5-C" 53. If the display shows "XXX XXX XXX", the "TEST 5-D" 54 is entered. If the display shows "No wires to loc", that result leads back to FIG. 5 at "CLAMPS" 35. At the end of test section 5-D, if the display 33 shows "Bad Tong signal', the method rechecks by returning at "TEST 5-D" 54. If the display shows a result "XXX --- ---", either a fault message "The motor is faulted" 55 or a fault message "The fault is in the cables" 56 is displayed. If the display shows "No wires to loc", that result leads back to FIG. 5 at "CLAMPS" 35.

For a leakage fault (i.e., to ground) test, the operator positions the current tong 44a as shown in FIG. 4B. The current tong 44a replaces the high accuracy current sensor on a per motor basis. Since it is now only necessary to reveal the faulty motor, knowing that there is a fault, the reduced accuracy of the current tong 44a will still be sufficient to indicate where the leakage current goes, after the leakage test has been applied to each individual motor.

Figure 12:
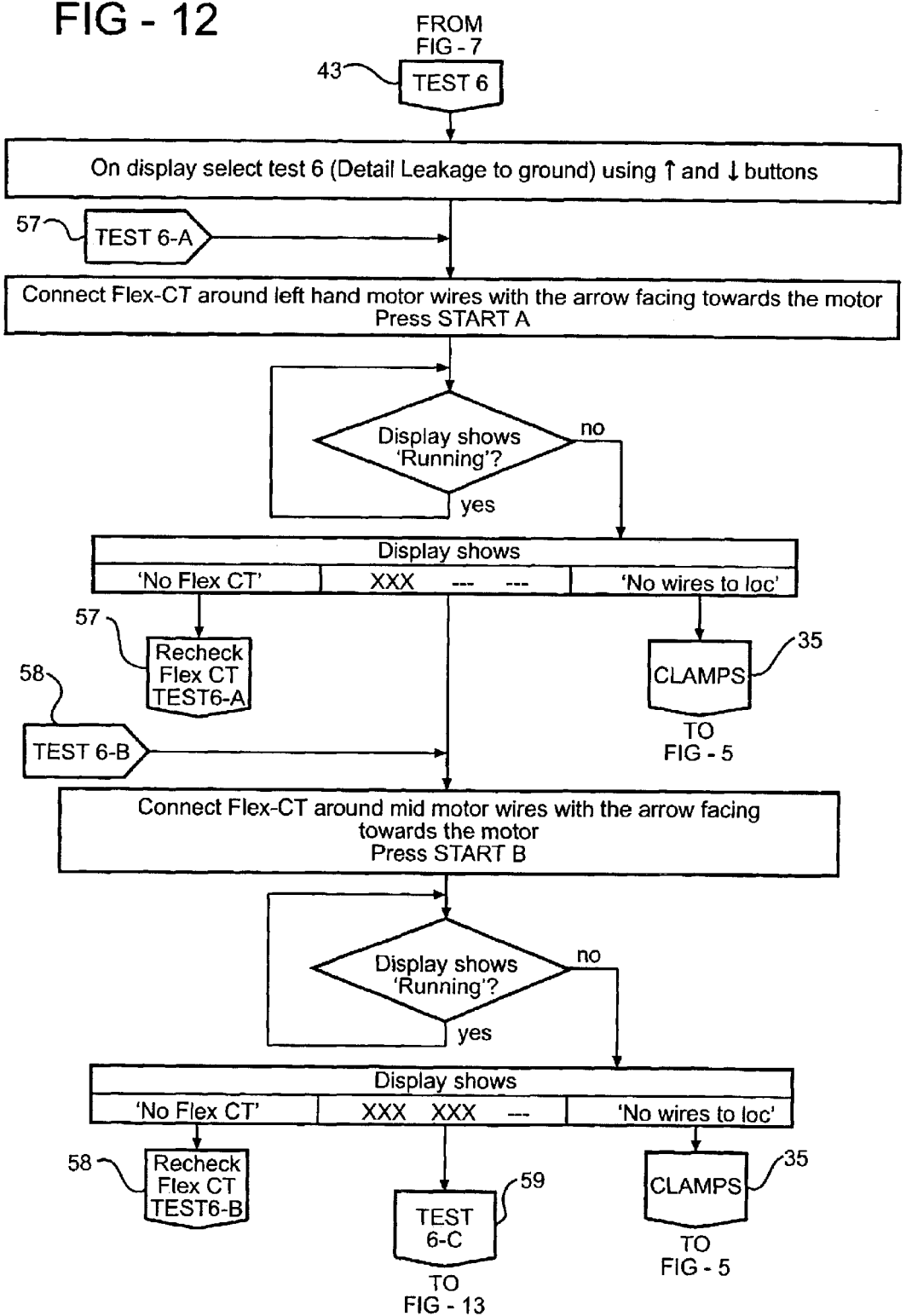

FIG. 12 shows test sections 6-A and 6-B of the detailed leakage to ground test starting at "TEST6" 43. At the end of the test section 6-A, if the display 33 shows "No Flex CT", the method rechecks by returning at "TEST 6-A" 57. If the display shows "XXX --- ---", the "TEST 6-B" 58 is entered. If the display shows "No wires to loc" that result leads back to FIG. 5 at "CLAMPS" 35. At the end of the test section 6-B, if the display 33 shows "No Flex CT", the method rechecks by returning at "TEST 6-B" 58. If the display shows a result "XXX XXX ---", the method proceeds to test section "TEST 6-C" 59 at FIG. 13. If the display shows "No wires to loc", that result leads back to FIG. 5 at "CLAMPS" 35.

Figure 13:
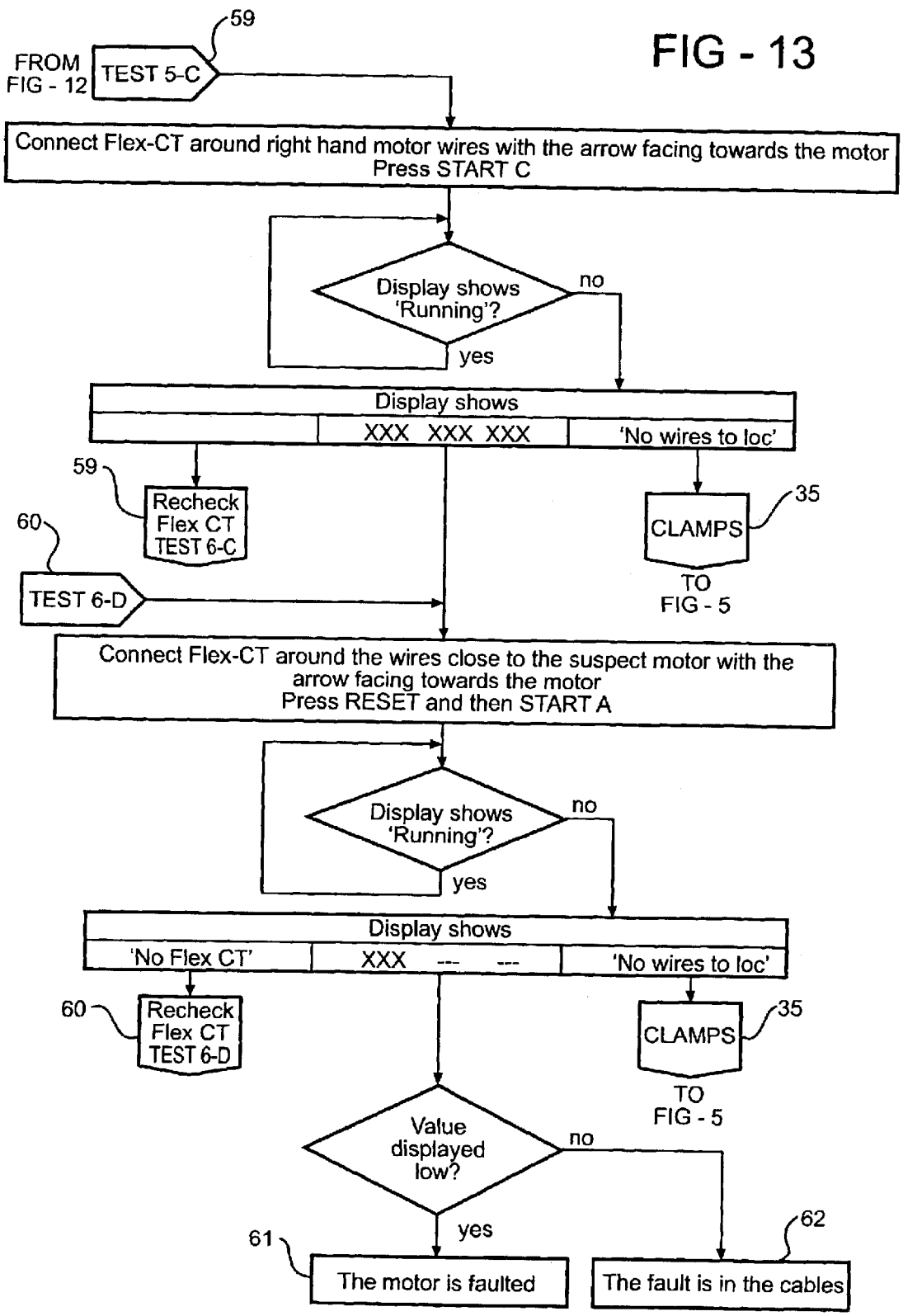

FIG. 13 shows the test sections 6-C and 6-D. At the end of test section 6-C, if the display 33 shows "No Flex CT", the method rechecks by returning at "TEST 6-C" 59. If the display shows "XXX XXX XXX", the "TEST 6-D" 60 is entered. If the display shows "No wires to loc", that result leads back to FIG. 5 at "CLAMPS" 35. At the end of test section 6-D, if the display 33 shows "No Flex CT", the method rechecks by returning at "TEST 6-D" 60. If the display shows a result "XXX --- ---", either a fault message "The motor is faulted" 61 or a fault message "The fault is in the cables" 62 is displayed. If the display shows "No wires to loc", that result leads back to FIG. 5 at "CLAMPS" 35.

There is shown in FIG. 14 the portable tester 30 in more detail. The power cord 31 is connected to an input of an internal power supply 63 that generates the power to operate the components of the tester 30 and the signals applied to the traction motor installation 20 (FIGS. 4A–4C). An output of the power supply 63 is connected to an input of a microprocessor 64 that controls the operation of the tester 30 and analyzes the responses received from the performance of the test sections. The microprocessor 64 is connected to the display 33 at a computer port 65. The microprocessor 64 provides output information to the display 33 for generating the visual indications identified in the preceding description of the fault detection method shown in FIGS. 5–13. The display 33 includes input devices 66, such as buttons or keys, for operator input of commands associated with performing the fault detection method.

The power supply 63 and the microprocessor 64 also are connected to a plurality of relays 67 to switch on and off the above-described voltages applied to the test leads 32 connected between the relays 67 and a plurality of connectors 68 for connecting to the three main cables 23 and the two ground points. The clamp-on current sensor 44a and the current tongs 44b are connected to inputs of the microprocessor 64 to generate the required current values sensed at the motor cables 24, 25 and 26.

In use, the portable tester 30 is carried to the location of the traction motor installation 20 in a locomotive. The power cord is connected a 120V AC power source, a first one of the ground test leads 32 is clamped to the locomotive chassis (bare metal), and the other one of the ground leads is clamped to a different metal part of the locomotive chassis. The main cables 23 are then disconnected from the inverter 21 and connected to the other three test leads 32 from the tester 30. All of the test leads 32 can be terminated by Alligator clamps for this purpose.

When the tester 30 is turned on, the display 33 and the input devices 66 can be used to select "TEST 1" and start the test. Any test in progress can be stopped by pressing an "ABORT" button of the input devices 66. When the test is completed, the result is displayed by the display 33 as a fault/no fault message (FIG. 6). "TEST 2" through "TEST 6" are performed in a similar manner. The "TEST 2" result is displayed as a percentage of winding impedance unbalance (FIG. 6). Since this quantity cannot be measured with great accuracy, unbalances up to a predetermined percentage should not be considered suspect and unbalances above the predetermined percentage are suspect and suggest proceeding to "TEST 5". The quantity 15% is used for illustrative purposes only and the predetermined percentage can be established in practice.

The "TEST 3" the result is displayed as a resistance to ground in Ohms ('<100 Ohm', or a value between 100 Ohm and 10 MOhm, or '>10 MOhm'). A resistance above 1 MOhm cannot be treated as suspect, since the detailed leakage test will not be able to trace down such values to a single motor. Below 1 MOhm the detailed test can be used, lower figures giving a more reliable outcome. The "TEST 4" is performed with the clamp-on current sensor (Flex CT) 44a attached around the motor cables going to one motor. The display 33 shows three placeholders for each result associated with the three different motors 27, 28 and 29. A "START A" button of the input devices 66 directs the result to the first placeholder, a "START B" button directs the result to the second placeholder; and a "START C" button directs the result to the third placeholder. The result of the test is a number between 0 and 100 which is a measure for the locally detected current flowing to ground including capacitive current. As soon as the test has been completed for all motors, the display 33 will blink the highest value designating the suspected motor.

The "TEST 5" requires the three current tongs 44b to be clipped onto the three motor wires going to one motor. The display 33 shows the three placeholders for each result associated with the three different motors. The result of the test is a percentage between zero and 100 which represents the locally measured amount of winding impedance unbalance. When the test has been completed for all motors, the display 33 will blink the highest value designating the suspected motor. However, the closer this blinking result is to the other numbers, the less reliable the outcome. The "TEST 6" requires the current sensor 44a to be attached around the motor cables going to one of the motors. The display 33 shows three placeholders for each result associated with the three different motors. The result of the test is a number between zero and 99 that is a measure for the locally detected resistance to ground. The display 33 will blink the lowest result designating the suspected motor. However, the closer this blinking result is to the other numbers, the less reliable the outcome.

In accordance with the provisions of the patent statutes, the present invention has been described in what is considered to represent its preferred embodiment. However, it should be noted that the invention can be practiced otherwise than as specifically illustrated and described without departing from its spirit or scope.

What is claimed is:

1. method of detecting faults in a traction motor installation having a plurality of AC traction motors powered from a common power source, each of the traction motors being connected by associated motor cables to a cable junction and the common power source being connected to the cable junction by main cables, the method comprising the steps of:
   a. disconnecting a traction motor common power source from a set of main cables connected to a cable junction, the cable junction being connected to a plurality of traction motors by associated motor cables;
   b. Performing an initial short circuit to grind test on the traction motors through the main cables;
   c. performing an initial short circuit between phases test on the traction motors through the main cables;
   d. performing an initial leakage to ground test on the traction motors through the main cables; and
   e. when a fault is detected by said initial tests, performing at least one detailed test by applying a predetermined voltage to the main cables and sensing current flow in the motor cables connected-to each of the motors.

2. The method according to claim 1 wherein said one detailed test is one of a detail short circuit to pound test, a detail short circuit phase to phase test, and a detail leakage to ground test.

3. The method according to claim 2 wherein said detail short circuit to ground test includes sensing a total value of current flow in the motor cables for each of the traction motors and designating the one of the traction motors with the highest value as having a suspected fault.

4. The method according to claim 3 wherein the predetermined voltage is a pulsed voltage signal with a high frequency content.

5. The method according to claim 4 wherein the current sensor is a Rogowski-type flexible clamp-on current sensor.

6. The method according to claim 3 including using a current sensor to sense the current flow in the motor cables.

7. The method according to claim 2 wherein said detail short circuit phase to phase test includes sensing a current flow in each of the motor cables for each of the traction motors, calculating a winding impedance unbalance value from the current flow and designating the one of the traction motors with the highest value as having a suspected fault.

8. The method according to claim 7 wherein the predetermined voltage is a pulsed 4.5 kV signal with a high frequency content.

9. The method according to claim 8 including using a separate current sensor to sense the current flow in each of the motor cables.

10. The method according to claim 2 wherein said detail leakage to ground test includes sensing a current flow in the motor cables for each of the traction motors, calculating a resistance to ground value from the current flow and designating the one of the traction motors with the lowest value as having a suspected fault.

11. The method according to claim 10 wherein the predetermined voltage is a 60 Hz 1 kV AC signal.

12. The method according to claim 10 including using a current sensor to sense the current flow in the motor cables.

13. The method according to claim 12 wherein the current sensor is a Rogowski-type flexible clamp-on current sensor.

14. An apparatus for performing the method according to claim 1 including a Rogowski-type flexible clamp-on current sensor for sensing a total current flow it the motor cables associated with each of the traction motors and a separate current sensor for sensing current flow in an associated one of the motor cables associated with each of the traction motors.

15. The apparatus according to claim 14 including a display for visually indicating results of the initial tests and the at least one detailed test.

16. The apparatus according to claim 14 including a portable tester having a display and being connected to said current sensors.

17. A method of detecting faults in a traction motor installation having a plurality of AC traction motors powered from a common power source, each of the traction motors being connected by associated motor cables to a cable junction and the common power source being connected to the cable junction by main cables, the method comprising the steps of:
   a. disconnecting a traction motor common power source from a set of main cables connected to a cable junction, the cable junction being connected to a plurality of traction motors by associated motor cables;
   b. applying a predetermined voltage to the main cables; and
   c. performing at least one detailed test by sensing current flow in the motor cables connected to each of the motors.

18. The method according to claim 17 wherein said detailed test is a detail short circuit to ground teat including sensing a total value of current flow in the motor cables for each of the traction motors and designating the one of the traction motors with the highest value as having a suspected fault.

19. The method according to claim 17 wherein said detailed test is a detail short circuit phase to phase test including sensing a current flow in each of the motor cables for each of the traction motors, calculating a winding impedance unbalance value from the current flow and designating the one of the traction motors with the highest value as having a suspected fault.

20. The method according to claim 17 wherein said detailed test is a detail leakage to ground test including sensing a current flow in the motor cables for each of the traction motors, calculating a resistance to ground value from the currant flow and designating the one of the traction motors with the lowest value as having a suspected fault.

* * * * *